(12) United States Patent
Tachibana et al.

(10) Patent No.: US 8,926,255 B2
(45) Date of Patent: Jan. 6, 2015

(54) COMPONENT TRANSFER APPARATUS AND METHOD

(75) Inventors: Katsuyoshi Tachibana, Tokyo (JP); Yoji Shinozaki, Tokyo (JP); Soichi Tateno, Tokyo (JP)

(73) Assignee: Hirata Corporation, Tokyo (JP)

( * ) Notice: Subject to any disclaimer, the term of this patent is extended or adjusted under 35 U.S.C. 154(b) by 646 days.

(21) Appl. No.: 12/671,135

(22) PCT Filed: Aug. 2, 2007

(86) PCT No.: PCT/JP2007/065134
§ 371 (c)(1),
(2), (4) Date: Mar. 9, 2010

(87) PCT Pub. No.: WO2009/016757
PCT Pub. Date: Feb. 5, 2009

(65) Prior Publication Data
US 2010/0196126 A1 Aug. 5, 2010

(51) Int. Cl.
*B66F 9/14* (2006.01)
*H01L 21/677* (2006.01)
*H01L 21/673* (2006.01)

(52) U.S. Cl.
CPC ...... *H01L 21/67778* (2013.01); *H01L 21/6732* (2013.01); *H01L 21/6734* (2013.01); *H01L 21/67766* (2013.01)
USPC .......................................... 414/671; 414/619

(58) Field of Classification Search
CPC ....... A61B 19/2203; A61B 19/22; B25J 3/00; B25J 19/00; B25J 15/04; B25J 9/02; B25J 15/0253; B25J 9/1065; B25J 9/046; B65F 3/046; B65F 3/04; B66F 9/187; B66F 7/0625; B66F 9/18; B66F 9/12; B66F 9/183; B66F 9/181; B66F 9/185; B66F 9/08; B66F 9/10; B66F 9/06; B66F 9/082; B66F 9/122; B66F 9/14; B66F 9/16; B66F 7/18; B66F 9/07; B66F 9/141; B62B 1/14; B62B 3/104; B62B 1/264; B62B 1/12; B64F 5/0036; B21D 43/105; B25H 1/00; B65G 47/90; B65G 57/00; B65G 61/00; B65G 1/0407; B65G 1/0435; B23Q 7/04; B23Q 7/1494; B66C 1/427; B66C 3/20; B66C 13/00; B66C 1/16; B66C 1/66; H01L 21/68; B65H 31/20; B65H 31/3045; B65D 19/38; B65D 19/44

USPC ......... 414/1, 2, 408, 450, 451, 589, 618, 619, 414/621, 630, 664, 667, 668, 671, 672, 729, 414/731, 741, 783, 900, 907, 917, 282, 591, 414/416.01, 928; 294/67.41
See application file for complete search history.

(56) References Cited

U.S. PATENT DOCUMENTS 1,843,736 A * 2/1932 Remde ........................... 414/622
1,900,569 A * 3/1933 Lederer .......................... 414/741
(Continued)

FOREIGN PATENT DOCUMENTS

JP 62-132014 6/1987
JP 5-294410 11/1993
(Continued)

OTHER PUBLICATIONS

International Search Report issued Sep. 18, 2007 in International (PCT) Application No. PCT/JP2007/065134.

*Primary Examiner* — Saul Rodriguez
*Assistant Examiner* — Glenn Myers
(74) *Attorney, Agent, or Firm* — Wenderoth, Lind & Ponack, LLP

(57) ABSTRACT

A component transfer apparatus and method includes a mounting member on which a lower frame of a rack can be mounted and which is driven to move up and down in order to take out or retrieve components from the rack in which the components can be aligned and accommodated in a vertical direction; an upper push member that is arranged to face the mounting member from above and driven to move up and down in order to push the upper frame of the rack from above; and a carrying hand that can reciprocate between a retracted position where it faces the upper push member from below and a protruding position where it protrudes from the upper push member in a horizontal direction and that is driven to move up and down so as to enter a space below the upper frame to carry and suspend the rack at the protruding position and so as to move down the rack onto the mounting member at the retracted position. As a result, the rack can be smoothly carried in or carried out and the components can be smoothly supplied and retrieved, whereby operation efficiency can be enhanced and productivity can be improved.

10 Claims, 13 Drawing Sheets

(56) References Cited

U.S. PATENT DOCUMENTS

| | | | | |
|---|---|---|---|---|
| 2,705,084 A | * | 3/1955 | Willfond | 410/34 |
| 2,763,390 A | * | 9/1956 | Vandemark | 414/621 |
| 2,807,382 A | * | 9/1957 | Schenkelberger | 414/620 |
| 3,115,262 A | * | 12/1963 | Avery | 414/622 |
| 3,721,143 A | * | 3/1973 | Domres | 83/646 |
| 3,762,576 A | * | 10/1973 | Castellano | 414/680 |
| 4,029,230 A | * | 6/1977 | Bolduc et al. | 414/622 |
| 4,115,172 A | * | 9/1978 | Baboff et al. | 156/115 |
| 4,219,300 A | * | 8/1980 | McMillan | 414/420 |
| 4,327,617 A | * | 5/1982 | Budzich et al. | 83/419 |
| 4,354,795 A | * | 10/1982 | Dutra, Jr. | 414/622 |
| 4,549,845 A | * | 10/1985 | Ramsey, Jr. | 414/620 |
| 4,621,852 A | * | 11/1986 | Maki | 294/86.4 |
| 4,657,471 A | * | 4/1987 | Shinoda et al. | 414/663 |
| 4,789,295 A | * | 12/1988 | Boucher et al. | 414/497 |
| 4,911,608 A | * | 3/1990 | Krappitz et al. | 414/796 |
| 5,040,942 A | * | 8/1991 | Brinker et al. | 414/796 |
| 5,102,283 A | * | 4/1992 | Balzola Elorza | 414/404 |
| 5,178,506 A | * | 1/1993 | Meschi | 414/268 |
| 5,373,782 A | * | 12/1994 | Stewart et al. | 100/233 |
| 5,391,050 A | * | 2/1995 | Gatteschi | 414/796 |
| 5,509,774 A | * | 4/1996 | Yoo | 414/622 |
| 6,082,797 A | * | 7/2000 | Antonette | 294/103.1 |
| 7,967,354 B2 | * | 6/2011 | Faulkner et al. | 294/103.1 |
| 2004/0115035 A1 | * | 6/2004 | Tygard | 414/621 |

FOREIGN PATENT DOCUMENTS

| | | |
|---|---|---|
| JP | 8-306712 | 11/1996 |
| JP | 10-87015 | 4/1998 |

* cited by examiner

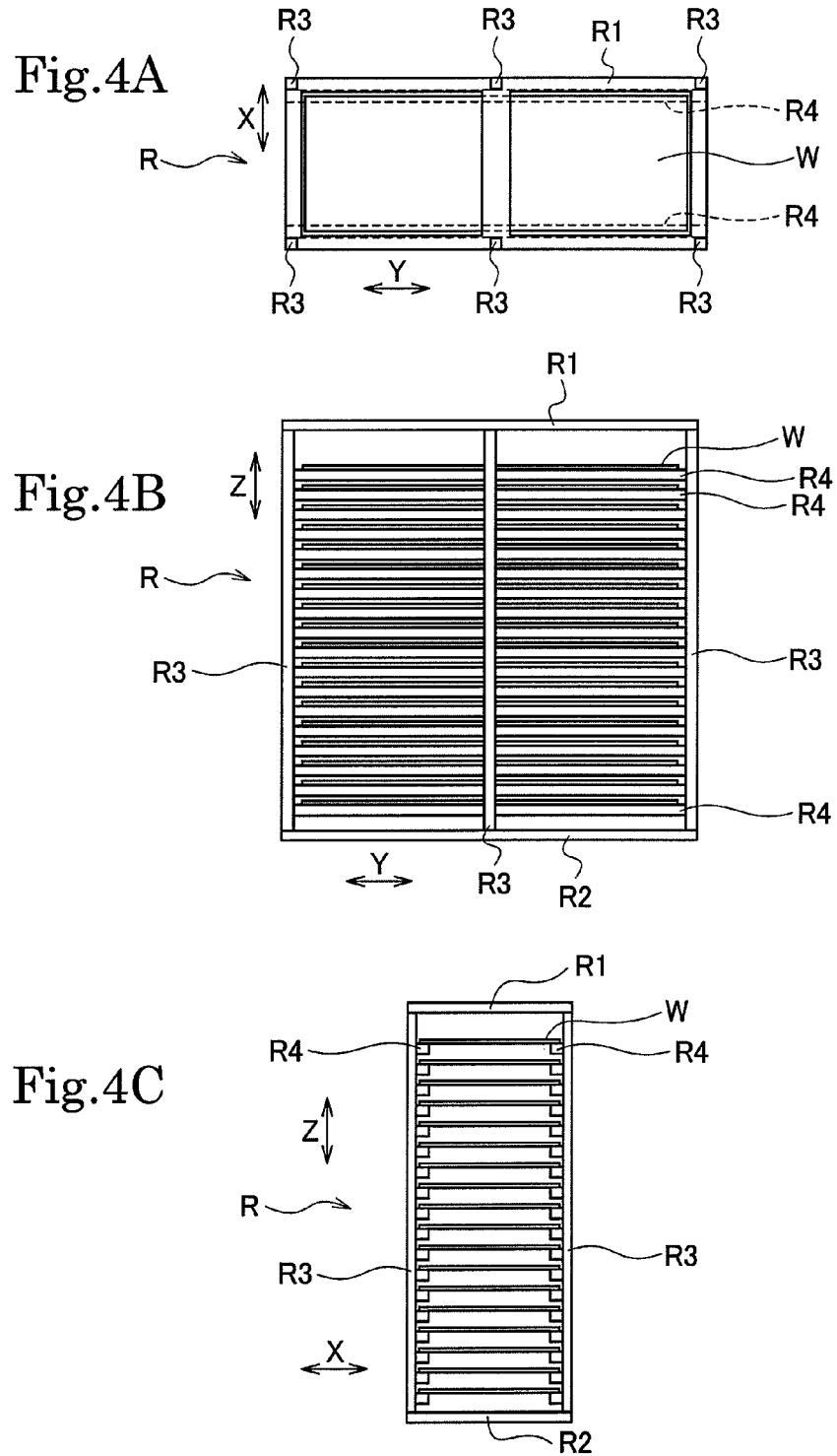

Fig.8
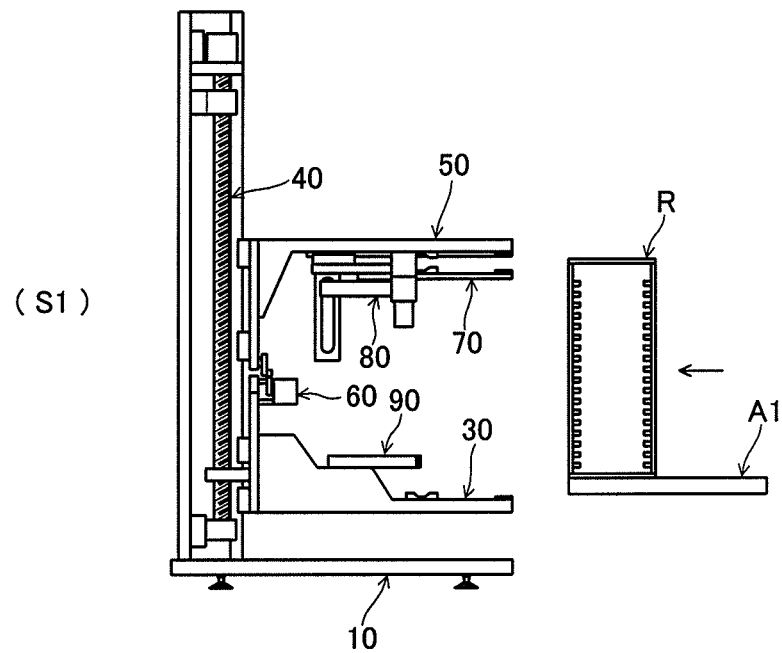
(S1)
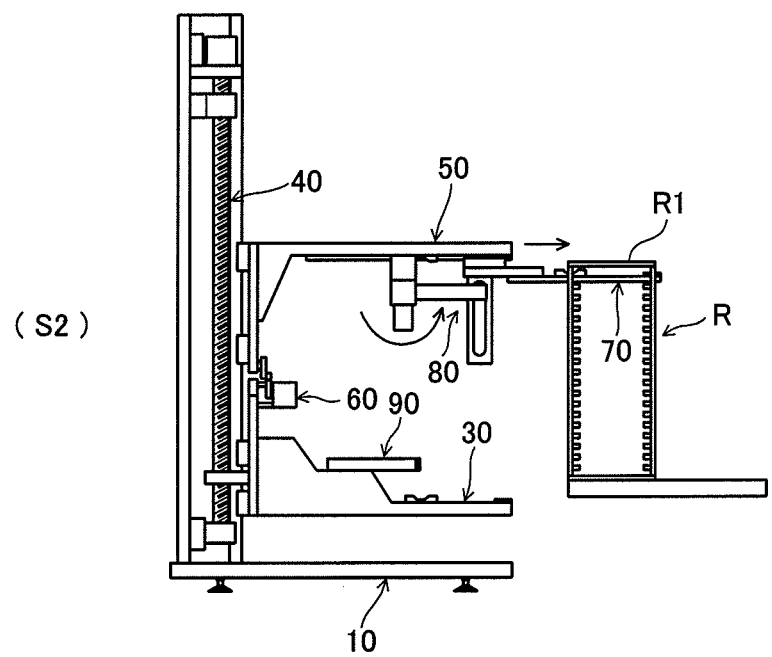
(S2)

Fig.9
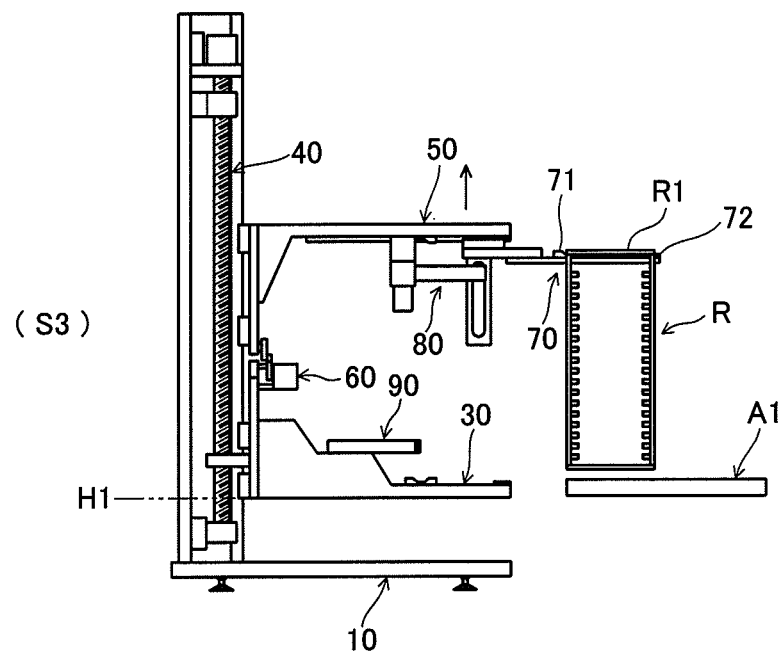
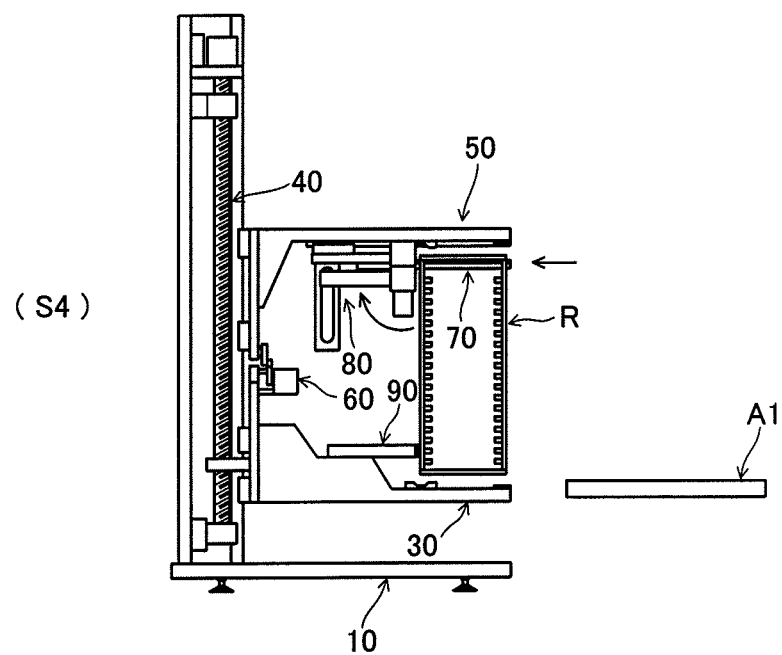

Fig.10
(S5)
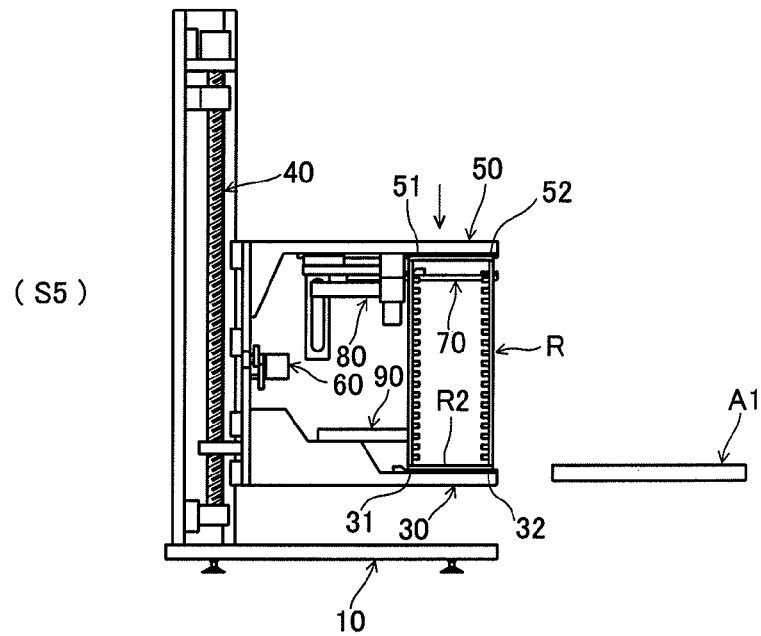
(S6)
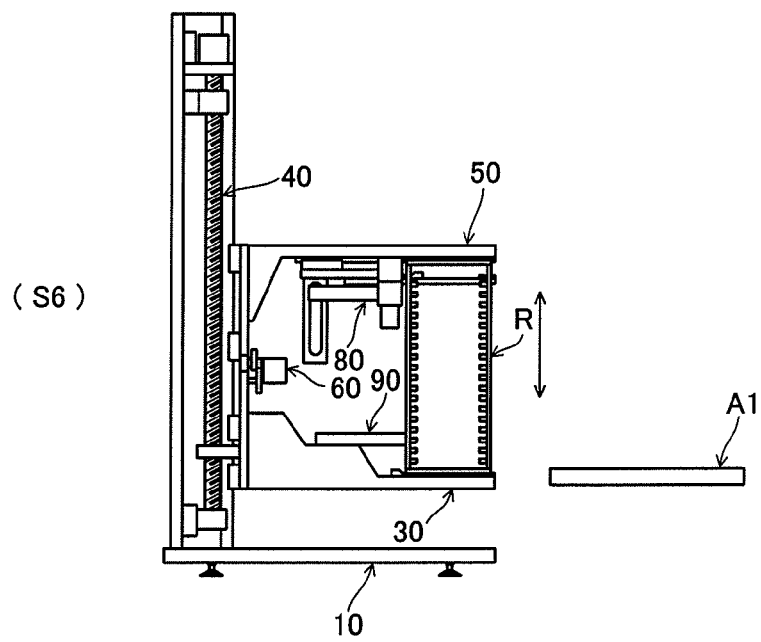

Fig.11
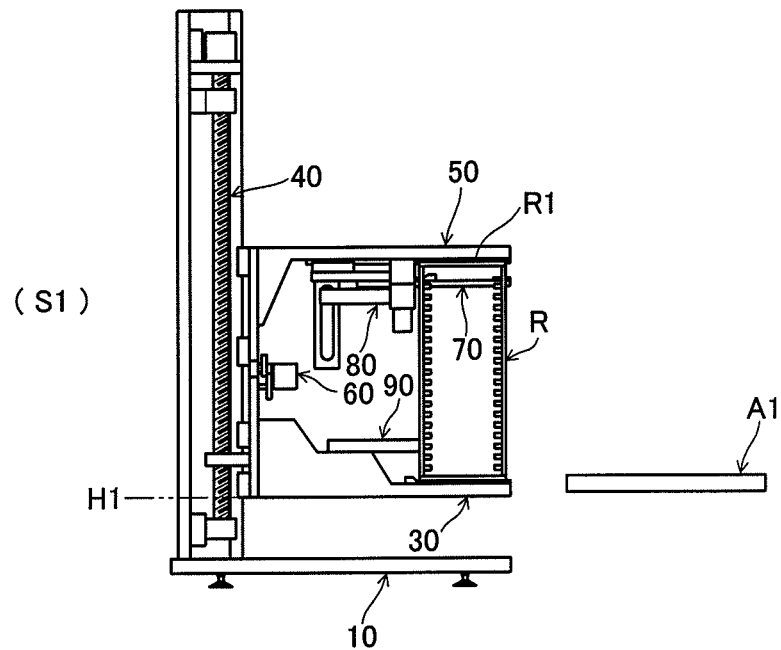
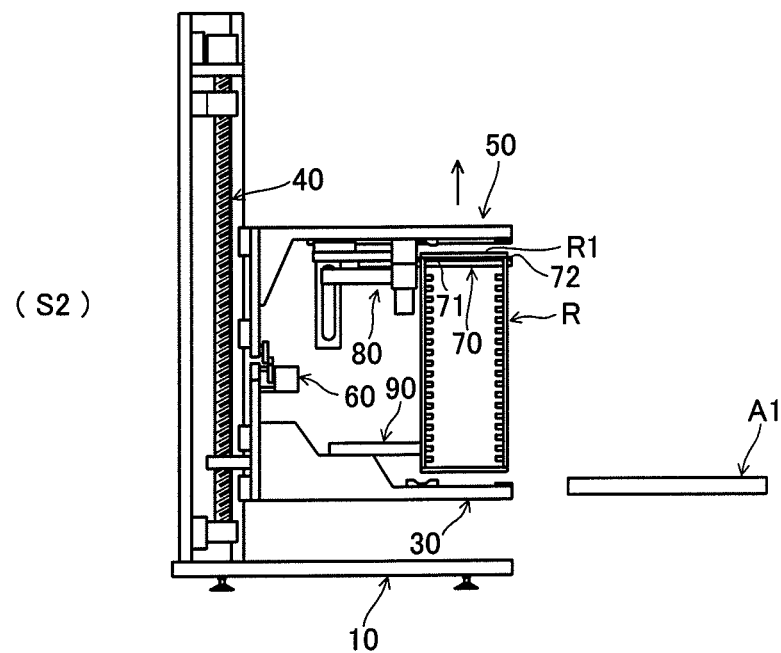

Fig.12
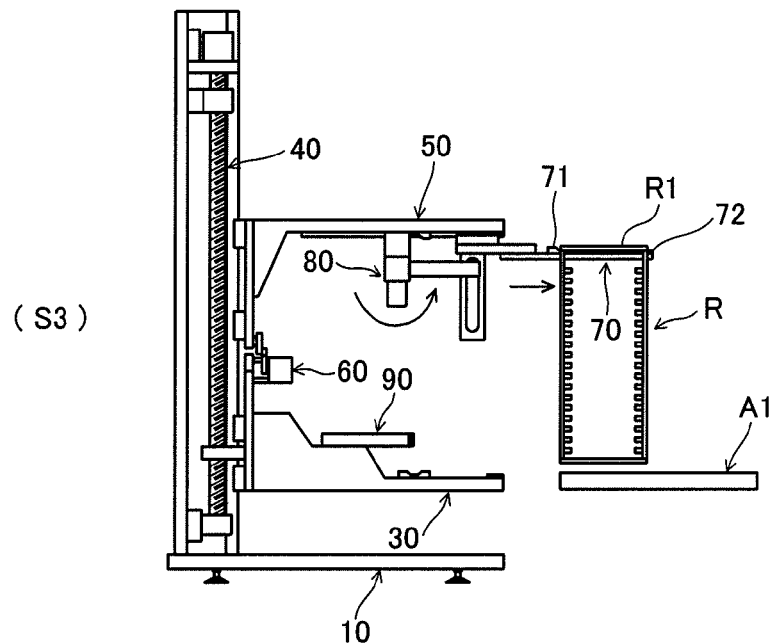
(S3)
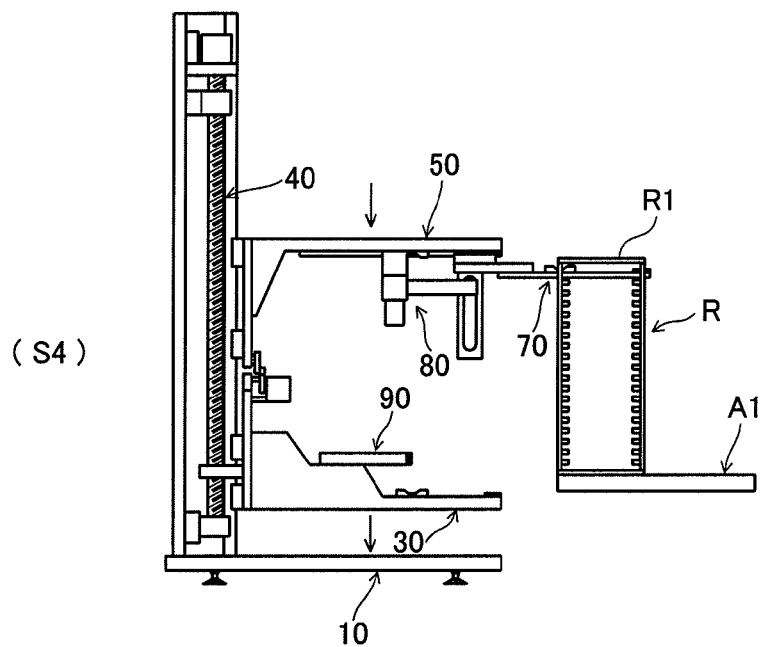
(S4)

COMPONENT TRANSFER APPARATUS AND METHOD

BACKGROUND OF THE INVENTION

I. Technical Field

The present invention relates to a component transfer apparatus and method that sets out a rack (or a magazine or a cassette) accommodating a component at a predetermined position and takes out the component accommodated in the rack to be supplied to a supply area or retrieves (or collect) the component to be accommodated in the rack, and more particularly to a component transfer apparatus and method that can carry in a rack to a predetermined position to be positioned or carry out the rack from the predetermined position in order to supply or retrieve a plate-like component such as a substrate.

II. Description of the Related Art

A rack (including, e.g., a magazine or a cassette) in which components for an electronic device or a machine are vertically aligned and accommodated has a slight error in dimension in accordance with each manufacturer even though it is applied to the same field. Further, there are racks having various conformations, e.g., one having high rigidity or low rigidity, one distorted due to use over the years, and others.

Therefore, when such a rack is transferred to a predetermined position to simply perform component supplying and retrieving operations without being assuredly positioned, these operations may not be smoothly performed and a fetch failure or a retrieval failure may possibly occur, thereby eventually affecting an entire production line using the components to lower a production efficiency.

Thus, as a conventional component transfer apparatus that supplies or retrieves components by using such a rack (a magazine), there is known an apparatus (a component supply apparatus) having a configuration that a positioning block which comes into contact with a side surface of a magazine and an adsorption transfer apparatus that adsorbs the side surface of the magazine by an adsorption pad to be transferred are provided to an elevator and the magazine is caused to collide with the positioning block to be positioned while adsorbing and sliding the magazine by the adsorption transfer apparatus when taking out the magazine from a magazine supply stage in order to take out the magazine mounted on the magazine supply stage to the elevator and sequentially take out components accommodated in the magazine or sequentially retrieve the same (see, e.g., Unexamined Japanese Patent Publication No. 8-306712).

However, in this apparatus, a flat sidewall surface must be provided to the magazine in order to adsorb the side surface of the magazine, and a region of this sidewall surface has a covered conformation. Therefore, workability when taking out and putting in each component with respect the magazine or visibility when confirming an accommodation state of each component from the outside is degraded.

Furthermore, since the magazine is moved while being dragged along a support surface when transferring the magazine between the magazine supply stage and the elevator, if there is a step between the magazine supply stage and the elevator, the magazine may be caught on this step or may receive an impact when getting over the step, whereby an untransferable state may occur or an accommodated component may possibly fall or may be damaged.

Moreover, to effect a transfer operation, there are required two types of energy systems, i.e., an electric energy system that activates a motor and others and an air energy system that sucks air for adsorption using the adsorption pad. Therefore, double facilities, managements and costs are required to supply these two types of energy.

Additionally, as another component transfer apparatus, there is known an apparatus (a plate-like member carrying and supplying apparatus) that includes a frame that can accommodate a rack, an elevator that moves up and down the frame, a first push mechanism provided in the frame to push from above and position the rack carried in with respect to a horizontal reference surface formed in the frame, and a second push mechanism provided in the frame to push from a lateral direction and position the rack carried in with respect to a vertical reference surface formed in the frame, thereby pushing the distorted rack from the vertical direction and the lateral direction to be corrected and set out at a predetermined position in the frame (see, e.g., Unexamined Japanese Patent Publication No. 10-87015).

However, this apparatus individually requires a driving mechanism (e.g., a cylinder) that pushes the frame from the vertical direction and a driving mechanism (e.g., a cylinder) that pushes the frame from the lateral direction, thereby leading to complication of a configuration, an increase in cost, and others. Further, the rack carried into the frame can be set out at the predetermined position in the frame, and the rack can be moved up and down, but the rack cannot be carried into the frame or carried out from the frame by using this apparatus, whereby a dedicated transfer apparatus that transfers the rack is required. Furthermore, when a cylinder or the like is used as the driving mechanism, a fluid energy system of a working fluid (air or a working oil) that actuates the cylinder is required besides an electric energy system. Therefore, double facilities, managements and costs are required to supply these two types of energy.

SUMMARY OF INVENTION

In view of the circumstances of the conventional technologies, it is an object of the present invention to provide a component transfer apparatus and method that can flexibly cope with various kinds of racks (or magazines or cassettes) used when supplying and retrieving components, and can smoothly and highly accurately perform transfer and positioning of each rack while achieving, e.g., simplification, miniaturization, or cost reduction of a configuration, thereby smoothly supplying and retrieving the components, and improving operation efficiency and productivity.

A component transfer apparatus according to a first aspect of the present invention that achieves the above-mentioned object is a component transfer apparatus that transfers components by transferring and positioning a rack at a predetermined position to take out or retrieve components from the rack, the rack including an upper frame, a lower frame, and vertical frames at four corners and being capable of aligning and accommodating the components in a vertical direction therein, the apparatus including: a mounting member that is configured to mount the lower frame of the rack thereon and driven to move up and down; an upper push member that is arranged to face the mounting member from above and driven to move up and down in order to push the upper frame of the rack from above; and a carrying hand that is configured to reciprocate between a retracted position where it faces the upper push member from below and a protruding position where it protrudes from the upper push member in a horizontal direction, and is driven to move up and down in order to enter a space below the upper frame to carry and suspend the rack at the protruding position and in order to move down the rack onto the mounting member at the retracted position.

According to this configuration, when carrying in the rack to the predetermined position, the carrying hand is protruded to carry and suspend the rack and then moves to the retracted position to mount the rack onto the mounting member, the rack can be set out and held at the predetermined position by being pushed by the upper push member, and the rack can be moved up and down step by step in a state that it is held by the upper push member and the mounting member, thereby sequentially taking out the components arranged in the vertical direction to be supplied to a supply area or retrieving the components from a retrieval area to be accommodated in the rack. On the other hand, when carrying out the rack from the predetermined position, the pushed state achieved by the upper push member is released, and the carrying hand is utilized to carry and suspend the rack and then moves to the protruding position, thus transferring the rack to a predetermined transfer area. Since the rack can be smoothly carried in or carried out and the components can be smoothly supplied and retrieved in this manner, operation efficiency can be enhanced, and productivity can be improved.

In particular, since the upper push member is arranged to face the mounting member from above and the carrying hand is arranged to face the upper push member from below at its retracted position, a series of carrying-in operations, i.e., carrying in the rack by the carrying hand, mounting onto the mounting member, and pushing by the upper push member and the positioning operation or release of the positioning and the carrying-out operation can be smoothly and efficiently executed. Furthermore, since the rack is transferred in a state that the upper frame of the rack is carried from the lower side and suspended by the carrying hand, the upright posture can be maintained by its own weight, impact shock or the like produced at the time of sliding and transferring can be avoided, and the components can be prevented from falling or being damaged.

The apparatus having the above-described configuration can adopt a structure where the carrying hand is provided to the upper push member so as to relatively move with respect to the upper push member.

According to this configuration, since the carrying hand is held to be movable with respect to the upper push member, simplification of the configuration can be achieved, and relative movement of both the members or a synchronized movement timing can be easily set.

The apparatus having the above-described configuration can adopt a structure where the upper push member is formed so as to move up and down with respect to the mounting member, and the carrying hand is formed so as to move with respect to the upper push member in the horizontal direction alone.

According to this configuration, since the rack can be moved up and down by just driving the upper push member to move up and down and the upper push member and the carrying hand integrally move in the vertical direction, the driving mechanism that moves up and down the upper push member can be also used as a driving mechanism that moves up and down the carrying hand to simplify the configuration, and the operation for pushing the rack by the upper push member can be performed in interlock (synchronization) with the operation for mounting the rack onto the mounting member.

The apparatus having the above-described configuration can adopt a structure where an elevation driving mechanism that drives the upper push member to move up and down is provided to the mounting member.

According to this configuration, an entire weight of the upper push member that moves up and down can be reduced, and the pushing operation or the pushing release operation can be smoothly performed.

The apparatus having the above-described configuration can adopt a structure where a guide portion that receives the lower frame of the rack and guides it to the predetermined position is formed in the mounting member, and a guide portion that receives the upper frame of the rack and guides it to the predetermined position is formed in the upper push member.

According to this configuration, since the guide portion is provided to each of the mounting member and the upper push member, when moving down the rack onto the mounting member in the suspended state and pushing the rack from above by using the upper push member, the rack is guided to the predetermined position by the guide portions in addition to the function that the rack maintains the upright posture by its own weight, and hence lateral displacement can be restricted and the rack can be accurately set out at the predetermined position without providing, e.g., a lateral pushing mechanism.

The apparatus having the above-described configuration can adopt a structure that includes an inclination restricting member that restricts an inclination of the rack when the rack is mounted on the mounting member.

According to this configuration, since the inclination restricting member can restrict the lateral displacement and the inclination of the rack, the rack can be more accurately set out at the predetermined position while simplifying the configuration.

The apparatus having the above-described configuration can adopt a structure that the inclination restricting member is formed so as to engage with outer surfaces of the vertical frames of the rack and engage with inner surfaces of the vertical frames of the rack when the carrying hand returns to the retracted position.

According to this configuration, since the inclination restricting member restricts (the vertical frame of) the rack by the outer surface and the inner surface thereof, the inclination can be avoided simultaneously with positioning in the horizontal direction and, in particular, the inner surface having a small error in manufacture is restricted, whereby the rack can be assuredly and highly accurately set out at the predetermined position.

A component transfer method according to a second aspect of the present invention that achieves the above-mentioned object is a component transfer method for transferring components by transferring and positioning a rack at a predetermined position to take out or retrieve components from the rack, the rack including an upper frame, a lower frame, and vertical frames at four corners and being capable of aligning and accommodating the components in a vertical direction therein, the method including: a carrying step of allowing a carrying hand to protrude from a retracted position and enter a space below the upper frame, and then carrying and suspending the rack; a mounting step of retracting the carrying hand to the retracted position and then lowering the carrying hand to mount the rack on a mounting member; and a pushing step of lowering an upper push member to push the upper frame of the rack mounted on the mounting member from above.

According to this configuration, since the carrying-in operation for the rack is performed based on a series of operations, i.e., the carrying step, the mounting step, and the pushing step, the rack can be smoothly carried in and set out at the predetermined position.

The method according to the second aspect having the above-described configuration can adopt a structure that the lowering operation of the carrying hand and the lowering operation of the upper push member are performed in synchronization with each other.

According to this configuration, the operation for pushing the rack by the upper push member can be smoothly continuously performed after the operation for mounting the rack onto the mounting member.

The method according to the second aspect of the present invention having the above-described configuration can adopt a structure that an inclination restricting operation for restricting an inclination of the rack and a guiding operation for guiding it to the predetermined position are performed at the mounting step and the pushing step.

According to this configuration, the rack can be highly accurately set out at the predetermined position while assuredly restricting the inclination of the rack.

The method according to the second aspect having the above-described configuration can adopt a structure that includes a moving up/down step of sequentially moving up or down the rack in state that the rack is fixed by the mounting member and the push member.

According to this configuration, when the rack is moved up and down step by step in the state that the rack is positioned and held, the components vertically aligned and accommodated can be sequentially taken out to be smoothly supplied to the supply area, and the components can be retrieved from the retrieval area to be smoothly accommodated.

Furthermore, a component transfer method according to a third aspect of the present invention that achieves the above-mentioned object is a component transfer method for transferring components by transferring a rack from a predetermined position to take out or retrieve components from the rack, the rack including an upper frame, a lower frame, and vertical frames at four corners and being capable of aligning and accommodating the components in a vertical direction therein, the method including: a pushing release step of moving up an upper push member that pushes the upper frame of the rack mounted on a mounting member from above to release pushing; a carrying step of moving up a carrying hand at a retracted position and carrying the upper frame from below to suspend the rack; and a transferring step of moving the carrying hand to a protruding position from the retracted position and then lowering the carrying hand to transfer the rack to a transfer area.

According to this configuration, since the rack carrying-out operation is performed based on a series of operations, i.e., the pushing release step, the carrying step, and the transferring step, the rack can be smoothly carried out and transferred from the predetermined position to the transfer area.

The method according to the third aspect having the above-described configuration can adopt a structure that the elevating operation of the upper push member and the elevating operation of the carrying hand are performed in synchronization with each other.

According to this configuration, the operation of carrying and suspending the rack by the carrying hand can be smoothly continuously performed after the operation of releasing the pushing by the upper push member.

The component transfer apparatus and method having the above-described configuration can flexibly cope with various kinds of racks (or magazines or cassettes) utilized when supplying and retrieving components, and can smoothly and highly accurately perform transfer and positioning each rack while achieving, e.g., simplification, miniaturization, or cost reduction of the configuration, and thereby smoothly supplying and retrieving the components, and improving operation efficiency and productivity.

BRIEF DESCRIPTION OF DRAWINGS

FIG. 4A is a plan view showing a rack used in the component transfer apparatus according to the present invention;

FIG. 4B is a front view showing the rack used in the component transfer apparatus according to the present invention;

FIG. 4C is a side view showing the rack used in the component transfer apparatus according to the present invention;

FIG. 8 is an operational view showing a transferring operation for carrying in the rack to a predetermined position by the component transfer apparatus according to the present invention;

FIG. 9 is an operational view showing the transferring operation for carrying in the rack to the predetermined position by the component transfer apparatus according to the present invention;

FIG. 10 is an operational view showing the transferring operation for carrying in the rack to the predetermined position by the component transfer apparatus according to the present invention;

FIG. 11 is an operational view showing the transferring operation for carrying out the rack from the predetermined position to a transfer area by the component transfer apparatus according to the present invention;

FIG. 12 is an operational view showing the transferring operation for carrying out the rack from the predetermined position to a transfer area by the component transfer apparatus according to the present invention.

DETAILED DESCRIPTION OF THE INVENTION

The best mode for carrying out the present invention will now be described hereinafter with reference to the accompanying drawings.

Figure 1:
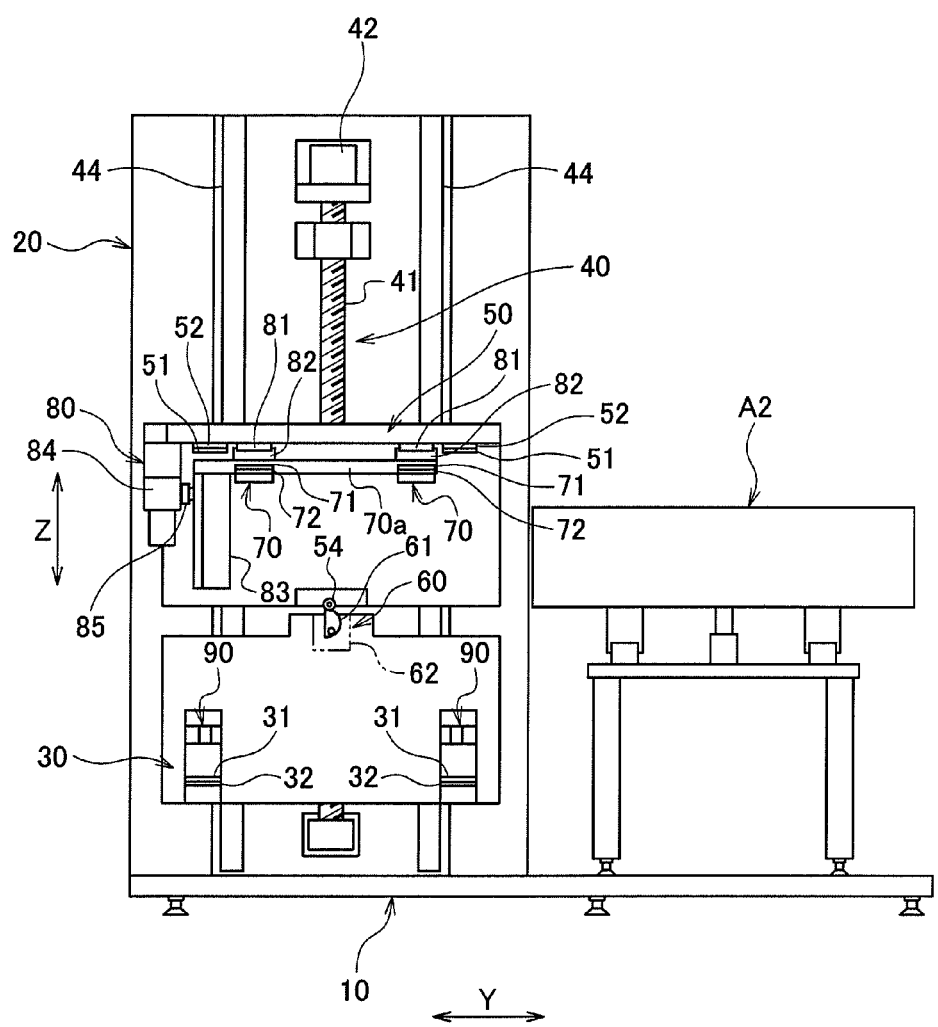
FIG. 1 is a front view showing an embodiment of a component transfer apparatus according to the present invention.
Figure 2:
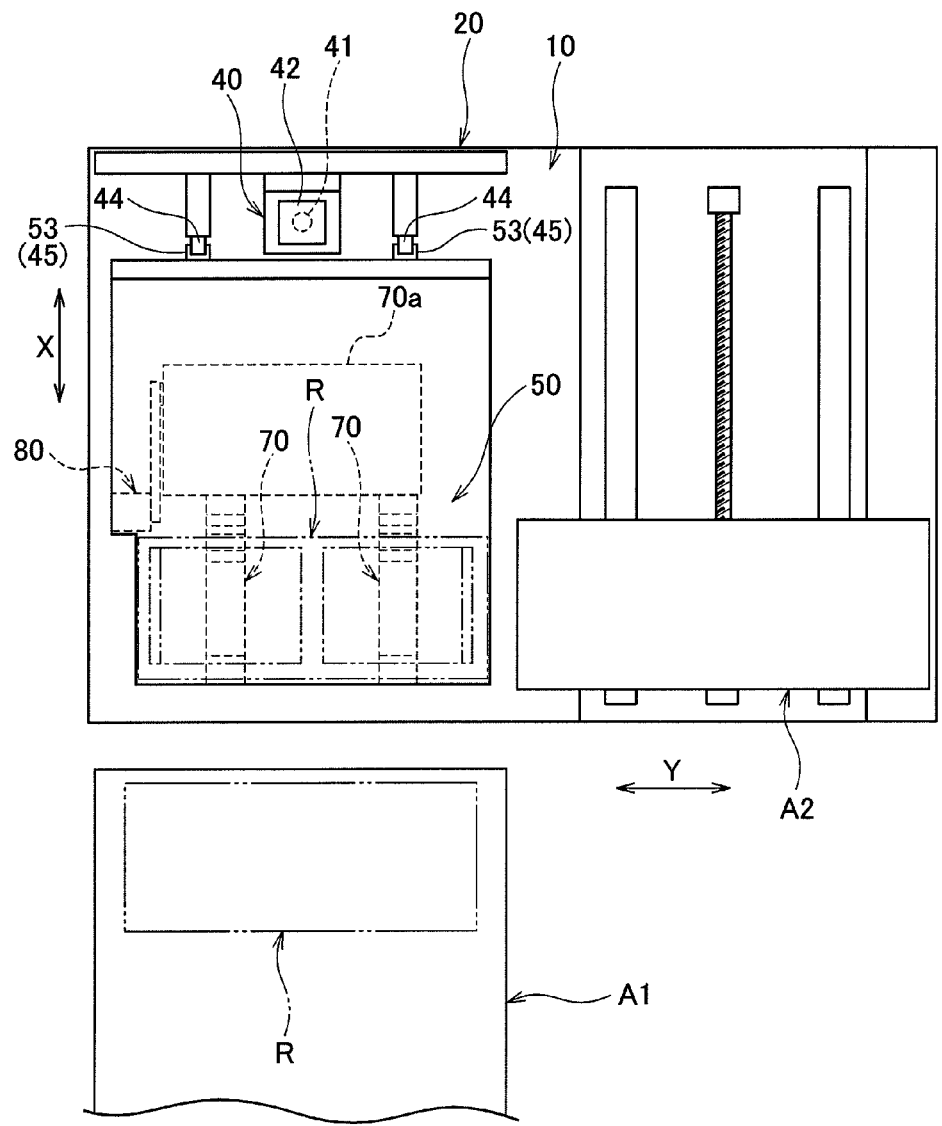
FIG. 2 is a plan view showing an embodiment of the component transfer apparatus according to the present invention.
Figure 3:
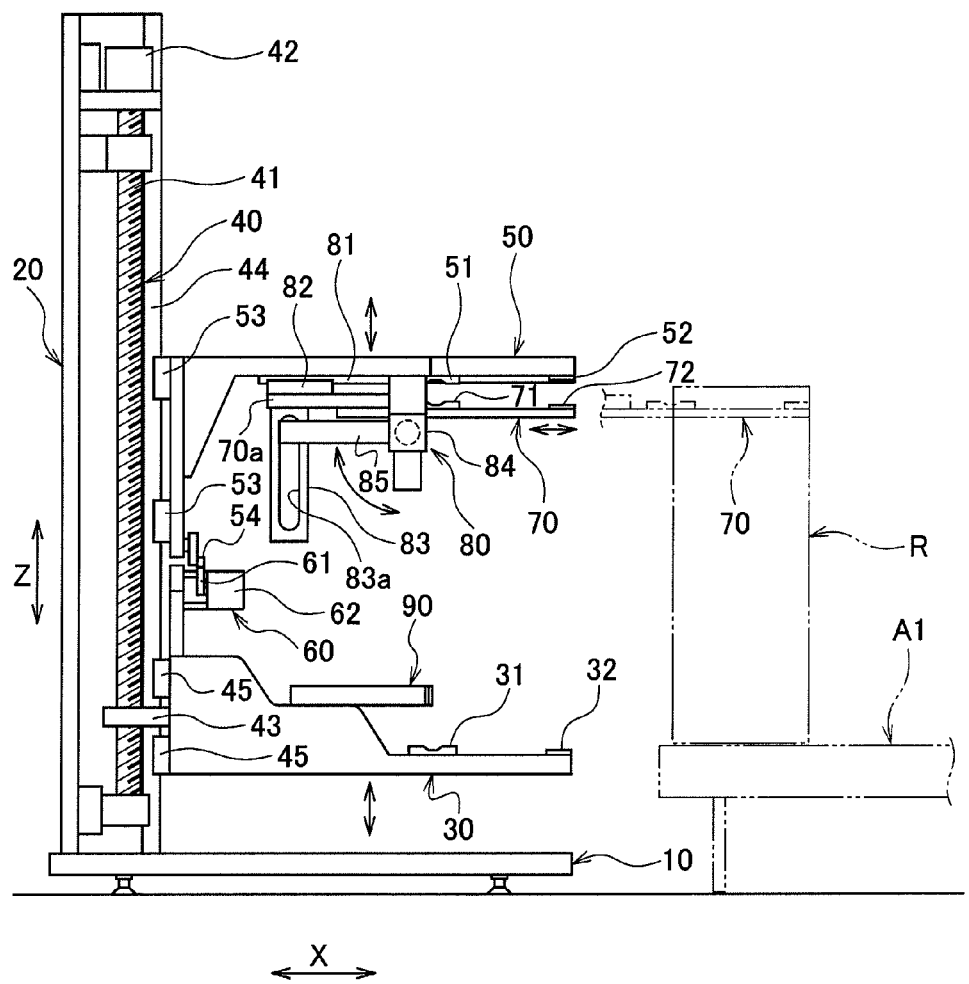
FIG. 3 is a side view showing an embodiment of the component transfer apparatus according to the present invention.

As shown in FIGS. 1 to 3, this component transfer apparatus includes a base 10, a support member 20 provided to stand upright on the base 10, a mounting member 30 on which a rack R can be mounted and which is provided to be capable of moving up and down in a vertical direction Z, a first elevation driving mechanism 40 that drives the mounting member 30 to move up and down, an upper push member 50 provided to be capable of moving up and down in the vertical direction Z in an upper area where it faces the mounting portion 30, a second elevation driving mechanism 60 that drives the upper push member 50 to move up and down, carrying hands 70 provided to be capable of reciprocating in a horizontal direction X with respect to the upper push member 50, a horizontal driving mechanism 80 that drives the carrying hands 70 to reciprocate in the horizontal direction X, inclination restricting members 90 provided on the mounting member 30, and others.

Further, as shown in FIGS. 1 to 3, a rack area A1 as a transfer area where the rack R is transferred at a position adjacent to this component transfer apparatus in the X direction and a component area A2 as a supply area where a component W taken out from the rack R is supplied or a retrieval area where the component W is retrieved at a position adjacent to the component transfer apparatus in the Y direction are arranged.

As shown in FIGS. 4A to 4C, the rack R has a substantially rectangular parallelepiped outer profile, and the rack includes an upper frame R1, a lower frame R2, vertical frames R3 provided at four corners and two central positions to couple the upper frame R1 with the lower frame R2, and mounting frames R4 which are provided on a plurality of levels with respect to the vertical frame R3 and can mount the components W thereon in such a manner that the components W each having a substantially rectangular plate-like shape can be aligned and accommodated in the vertical direction W. It is to be noted that each of the frames R1, R2, R3, and R4 is formed to have a substantially rectangular cross section.

Furthermore, the rack R defines between the upper frame R1 and the mounting frame R4 on the uppermost level a predetermined gap where the carrying hands 70 can enter the space under the upper frame R1 and move up and down to perform a carrying operation and a carrying release operation for the rack R.

As shown in FIGS. 1 to 3, the base 10 is formed into a substantially rectangular tabular shape, and it fixes the support member 20 and carries the component area A2 thereon.

As shown in FIGS. 1 to 3, the support member 20 is fixed on one side portion of the base 10 so as to stand upright in the perpendicular direction, and it holds the mounting member 30, the upper push member 50, the carrying hands 70, and others to allow their upward and downward movement.

As shown in FIGS. 1 to 3 and FIG. 6, the mounting member 30 is formed so as to be capable of mounting the lower frame R2 of the rack R thereon and moving up and down in the vertical direction Z.

Figure 6:
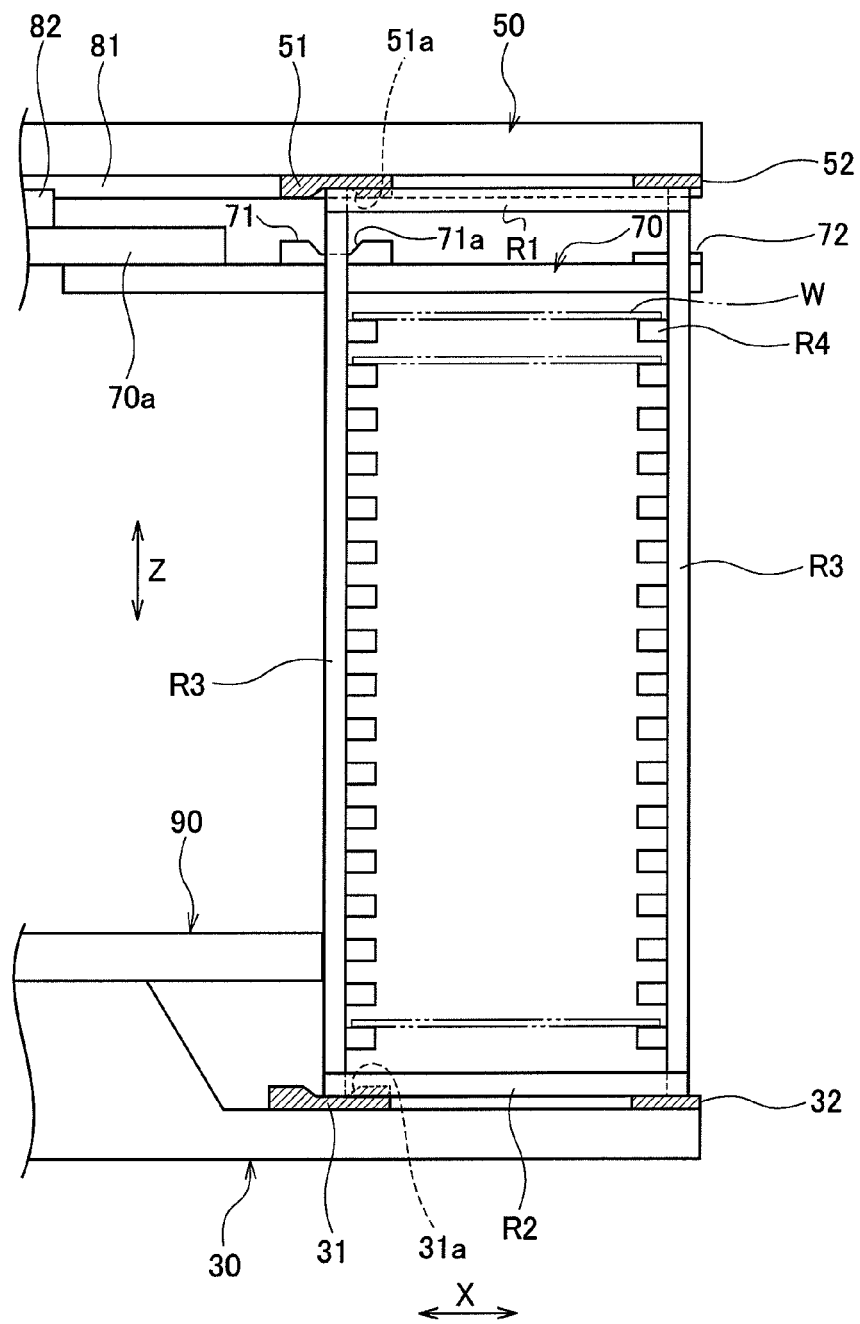
FIG. 6 is a side view showing a state that the rack is positioned, pushed, and fixed at a predetermined position by a mounting member, an upper push member, and an inclination restricting member forming a part of the component transfer apparatus.
Figure 7:
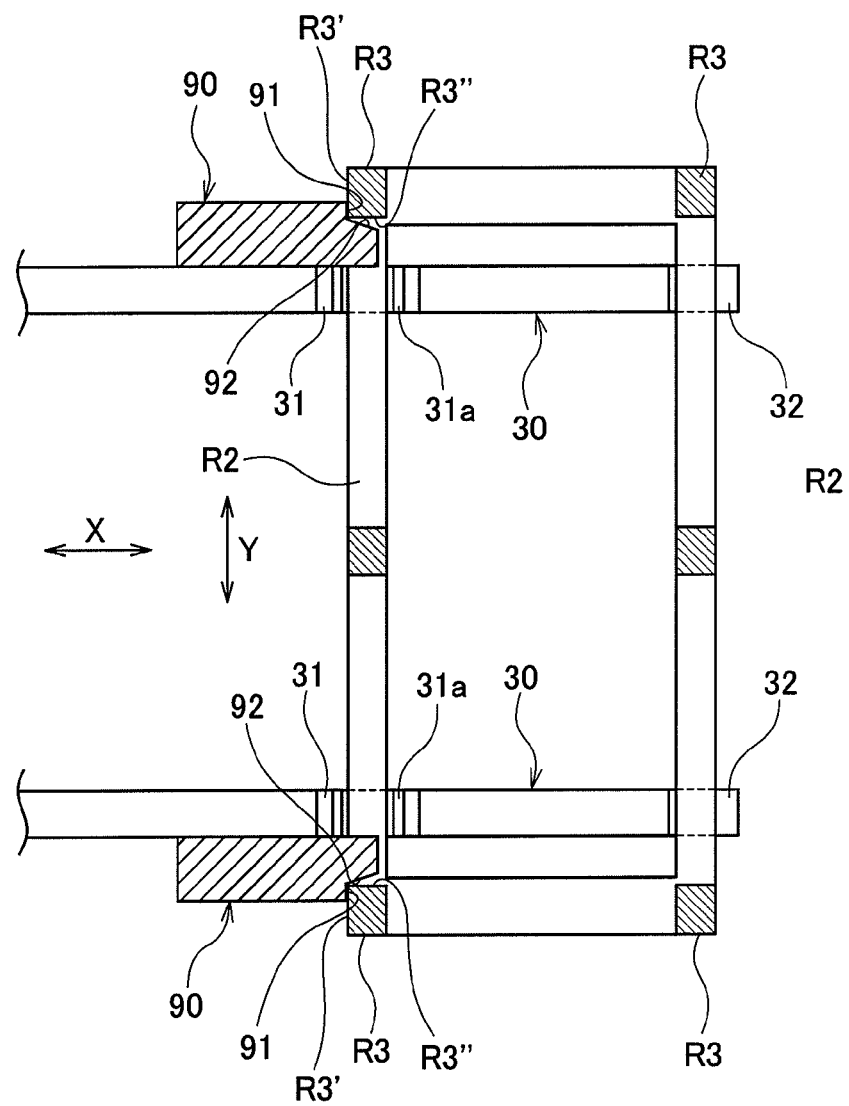
FIG. 7 is a cross-sectional view showing a state that the inclination restricting member forming a part of the component transfer apparatus restricts an inclination of the rack.

The mounting member 30 has (two) mounting portions 31 and (two) mounting portions 32 that define a predetermined position at which the lower frame R2 of the rack R is mounted as shown in FIG. 6 when moving down the rack R suspended by the carrying hands 70 to be set out at the predetermined position, and an inclined surface 31a as a guide portion that guides toward the predetermined position is formed on each mounting portion 31 provided on one side.

As described above, since each inclined surface 31a that receives the lower frame R2 of the rack R and guides it to the predetermined position is formed in the mounting member 30, the rack R is guided to the predetermined position by each inclined surface 31a in addition to a function that the rack R maintains an upright posture by its own weight when mounting the rack R onto the mounting member 30 from the suspended state, whereby lateral displacement is restricted and the rack can be highly accurately set out at the predetermined position without providing, e.g., a lateral push mechanism.

As shown in FIGS. 1 to 3, the first elevation driving mechanism 40 includes a leadscrew 41 that is supported to be capable of rotating with respect to the support member 20 and extends in the vertical direction Z, a driving motor 42 that drives the leadscrew 41 to rotate, a female screw member 43 that is fixed to the mounting member 30 and screwed to the leadscrew 41, guide rails 44 that are fixed to the support member 20 and extend in the vertical direction Z, guided portions 45 that are fixed to the mounting member 30 and slidably fitted to the guide rails 44, and others.

Moreover, when the driving motor 42 positively rotates (or negatively rotates), the leadscrew 41 positively rotates (or negatively rotates), the guided portions 45 are guided by the two guide rails 44, and the mounting member 30 is driven to move up (or driven to move down).

As shown in FIGS. 1 to 3 and FIG. 6, the upper push member 50 is arranged to face the mounting member 30 from above, and it is formed to allow its relative upward and downward movement in the vertical direction Z with respect to the mounting member 30 so that the upper frame R1 of the rack R can be pushed from the upper side.

The upper push member 50 has (two) push portions 51 and (two) push portions 52 that push the upper frame R1 of the rack R as shown in FIG. 6 when positioning the rack R on the mounting portions 31 and 32 (a predetermined position) of the mounting member 30, and an inclined surface 51a as a guide portion that guides toward the predetermined position is formed on each push portion 51 on one side.

As described above, since each inclined surface 51a that receives the upper frame R1 of the rack R and guides it to the predetermined position is formed in the upper push member 50, the rack R is guided to the predetermined position by each inclined surface 51a in addition to the function that the rack R maintains an upright posture by its own weight when mounting the rack R onto the mounting member 30 in the suspended state and pushing it by the upper push member 50 from above, whereby lateral displacement can be restricted and the rack can be highly accurately set out at the predetermined position without providing, e.g., a lateral push mechanism.

Additionally, the upper push member 50 includes guided portions 53 that are slidably fitted to the guide rails 44, a follower member 54 that engages with a cam member 62 of the later-explained second elevation driving mechanism 60, and others, thereby being driven to move up and down.

As shown in FIGS. 1 and 3, the second elevation driving mechanism 60 is provided on the mounting member 30, and it includes a cam member 61 having a predetermined cam lift amount in the vertical direction Z, a driving motor 62 that drives the cam member 61 to rotate, and others so as to move up and down the upper push member 50 and the carrying hands 70 all together.

The cam member 61 engages with the follower portion 54 of the upper push member 50, and it is configured to move up and down the upper push member 50 (and the carrying hands 70) by a predetermined height with respect to the mounting member 30 when it rotates in a predetermined angle range.

That is, the upper push member 50 relatively moves down with respect to the mounting member 30 so as to push the upper frame R1 of the rack R mounted on (the mounting portions 31 and 32 of) the mounting member 30 from above and the carrying hands 70 move down so as to mount the suspended rack R on the mounting member 30 when the driving motor 61 rotates in one direction and, on the other hand, the upper push member 50 relatively moves up with respect to the mounting member 30 so as to release the pushed state of the upper frame R1 of the rack R and the carrying hands 70 move up so as to carry the upper frame R1 and thereby suspend the rack R when the driving motor 62 rotates in the other direction.

As described above, since the second elevation driving mechanism 60 is provided on the mounting member 30, an entire weight of the upper push member 50 that moves up and down can be reduced, and the pushing operation and the pushing release operation can be smoothly effected. Further, since the upper push member 50 is formed to relatively move up and down with respect to the mounting member 30, just driving the first elevation driving mechanism 40 to move up and down the mounting member 30 enables moving up and down the rack R in a state that the rack R is mounted and positioned.

As shown in FIGS. 1 to 3, 5A, 5B, and 6, the carrying hands 70 extend from a common slider 70a in the horizontal direction X in a cantilever shape, are supported to be capable of relatively reciprocating in the horizontal direction X alone with respect to the upper push member 50, and are formed to be capable of reciprocating between a retracted position (a position indicated by solid lines in FIG. 3) where the carrying hands 70 face the upper push member 50 from below and a protruding position (a position indicated by chain double-dashed lines in FIG. 3) where the carrying hands 70 protrudes from the upper push member 50 in the horizontal direction.

Furthermore, the carrying hands 70 enter the space below the upper frame R1 of the rack R and carry and suspend the rack R at the protruding position, and are driven so as to move up and down together with the upper push member 50 to mount the rack R on the mounting member 30 at the retracted position.

Figure 5A:
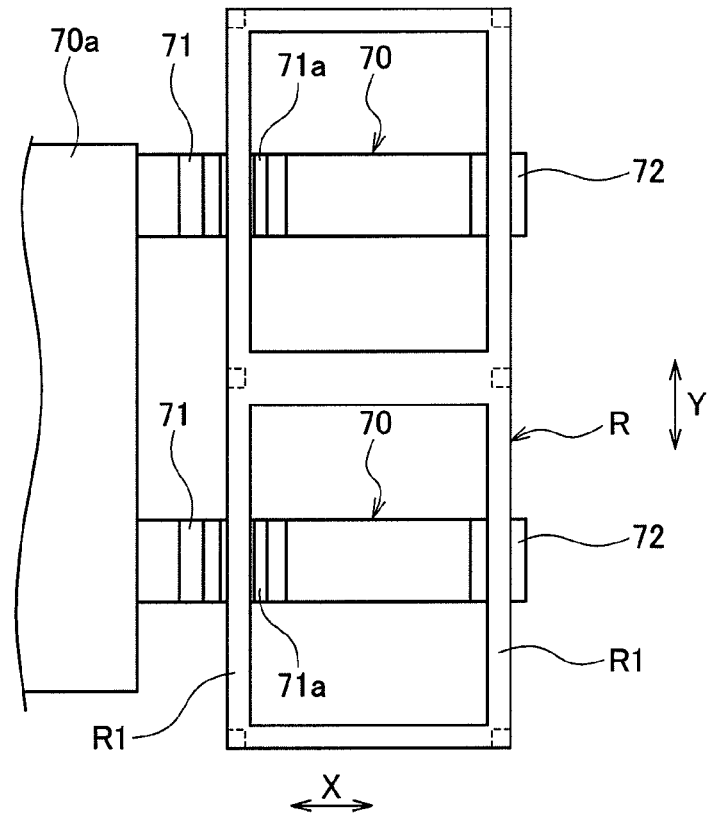
FIG. 5A is a plan view showing a state that a carrying hand forming a part of the component transfer apparatus carries and suspends the rack.
Figure 5B:
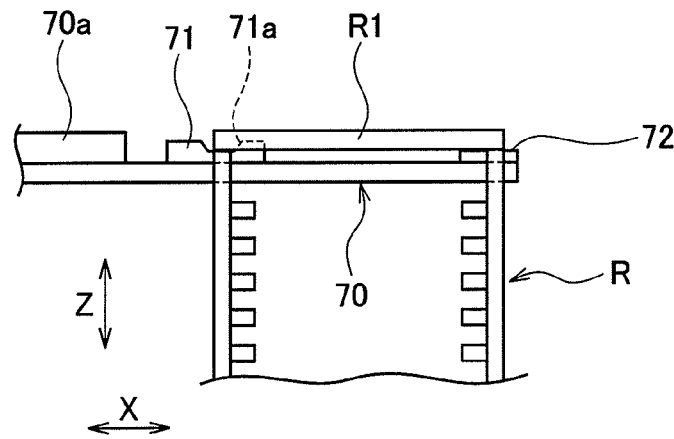
FIG. 5B is a partial side view showing a state that the carrying hand forming a part of the component transfer apparatus carries and suspends the rack.

Moreover, each carrying hand 70 has carrying portions 71 and 72 that carry the upper frame R1 of the rack R as shown in FIGS. 5A and 5B when entering the space below the upper frame R1 of the rack R to carry it, and an inclined surface 71a that restricts displacement of the rack R is formed on the carrying portion 71 on one side.

As described above, since the carrying hands 70 are formed to relatively move in the horizontal direction X alone with respect to the upper push member 50, the second elevation driving mechanism 60 that moves up and down the upper push member 50 can also function as the driving mechanism that moves up and down the carrying hands 70 to simplify the configuration as described above, and the operation for pushing the rack R by the upper push member 50 can be carried out in interlock (synchronization) with the operation for mounting the rack R on the mounting member 30.

As shown in FIGS. 1 and 3, the horizontal driving mechanism 80 includes guide rails 81 provided to extend in the horizontal direction X on the lower surface of the upper push member 50, guided portions 82 that are provided on the upper surface of the common slider 70a of the carrying hands 70 and slidably fitted to the guide rails 81, a long groove member 83 that defines a long groove 83a downwardly extending from the common slider 70a, a driving motor 84 fixed to the upper push member 50, an oscillating arm 85 that is directly coupled with the driving motor 84 and driven to oscillate and has an end slidably coupled with the long groove 83a and others.

That is, the oscillating arm 85 rotates in the clockwise direction in FIG. 3 to move to a substantially horizontal position facing the left-hand side and the carrying hands 70 are set out at the retracted position where the carrying hands 70 face the upper push member 50 from the lower side when the driving motor 84 rotates at a predetermined angle alone in one direction and, on the other hand, the oscillating arm 85 rotates in the counterclockwise direction in FIG. 3 to move to a substantially horizontal direction facing the right-hand side and the carrying hands 70 are set out at the protruding position where the carrying hands 70 protrude from the upper push member 50 in the horizontal direction X when the driving motor 84 rotates a predetermined angle alone in the other direction.

As shown in FIGS. 1, 3, 6, and 7, the two inclination restricting members 90 are provided with respect to the mounting member 30, and each of the inclination restricting members 90 is formed so as to define an end face 91 that engages with an outer surface R3' of the vertical frame R3 of the rack R, and an inclined surface 92 that engages with an inner surface R3" of the vertical frame R3 when the carrying hands 70 return to the retracted position.

Moreover, when the rack R is mounted on the mounting member 30, the end face 91 engages with the outer surface R3' and the inclined surface 92 engages with the inner surface R3", whereby the inclination restricting members 90 position the vertical frame R3 of the rack R at the predetermined position in the horizontal direction X and avoid inclination of the rack R. As a result, the configuration can be simplified, lateral displacement and inclination of the rack R can be restricted, the rack R can be highly accurately set out at the predetermined position, and the inner surface R3" having a small error (variations) in manufacture can be restricted in particular, thereby assuredly and highly accurately setting out the rack R at the predetermined position.

A carrying-in operation (a transfer method) for the rack R by the above-mentioned apparatus will now be described with reference to FIGS. 8 to 10.

First, as shown in (S1) in FIG. 8, the rack R is brought in by a conveyor or an operator to enter a standby mode at a transfer position in the rack area A1. It is to be noted that an empty state of the rack R is shown in this example.

Subsequently, as shown in (S2) in FIG. 8, the carrying hands 70 move from the retracted position where the carrying hands 70 face the upper push member 50 toward the protruding position where the carrying hands 70 protrude in the horizontal direction X by the protrusion driving of the horizontal driving mechanism 80, and the carrying hands 70 enter the space below the upper frame R1 of the rack R.

Then, as shown in (S3) in FIG. 9, the carrying hands 70 move up for a predetermined height together with the mounting member 30 and the upper push member 50 by the upward driving of the first elevation driving mechanism 40, and they are thereby set out at a rack delivery/receipt position (a position where the mounting member 30 has a height H1). As a result, the carrying hands 70 carry (lift up) the upper frame R1 from the lower side and maintain the rack R in a suspended state (a carrying step).

At this moment, the carrying hands 70 carry the upper frame R1 on the carrying portions 71 and 72 and also restrict displacement of the upper frame R1 by the inclined surfaces 71a.

Subsequently, as shown in (S4) in FIG. 9, the carrying hands 70 move to and stop at the retracted position where the carrying hands 70 face the upper push member 50 from the lower side by the retraction driving of the horizontal driving mechanism 80. At this time, the rack R is positioned immediately above the position where the rack R is mounted on the mounting member 30. Moreover, the inclination restricting members 90 engage with the vertical frames R3 of the rack R to restrict lateral displacement and inclination of the rack R.

Then, as shown in (S5) in FIG. 10, by the downward driving of the second elevation driving mechanism 60, the upper push member 50 and the carrying hands 70 move down all together (in synchronization with each other), the lower frame R2 is guided by the inclined surfaces 31a to restrict its displacement, (the lower frame R2 of) the rack R is mounted on the mounting portions 31 and 32, and the carrying hands 70 move down to be apart from the upper frame R1, thereby releasing the carrying (a mounting step). Additionally, the upper push member 50 pushes the upper frame R1 of the rack R mounted on the mounting member 30 from the upper side by using the push portions 51 and 52 thereof (a pushing step).

As a result, the rack R is positioned and held (fixed) at the predetermined position by the mounting member 30 and the upper push member 50.

Since the carrying-in operation for the rack R is performed as a series of operations, i.e., the carrying step, the mounting step, and the pushing step in this manner, the rack R can be smoothly carried in and set out at the predetermined position. Further, in this example, since the lowering operation for the carrying hands 70 and the lowering operation for the upper push member 50 are performed in synchronization with each other, the operation for pushing the rack R by using the upper push member 50 can be smoothly continuously effected after the operation for mounting the rack R on the mounting member 30.

Additionally, at the mounting step (the operation for retracting the carrying hands 70) and the pushing step, since the inclination restricting operation for restricting the inclination of the rack R and the guiding operation for guiding to the predetermined position are carried out, whereby the rack R can be highly accurately set out at the predetermined position while assuredly restricting the inclination of the rack R.

Thereafter, as shown in (S6) in FIG. 10, the rack R moves up or down in the vertical direction Z step by step by the elevation driving of the first elevation driving mechanism 40 to perform a transferring operation for sequentially retrieving the components W from the component area A2 (an elevating step).

It is to be noted that the example where the rack R to be carried in is empty has been described here, but a transferring operation for sequentially taking out and supplying the components W to the component area A2 is carried out when the rack R is filled with the components W.

Figure 13:
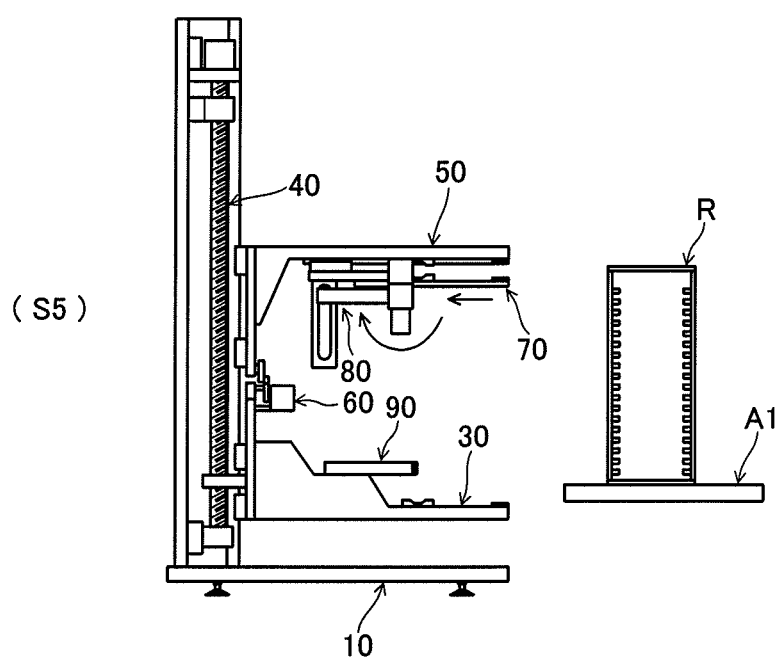
FIG. 13 is an operational view showing the transferring operation for carrying out the rack from the predetermined position to a transfer area by the component transfer apparatus according to the present invention.

The carrying-out operation (the transfer method) of the rack R performed by the above-mentioned apparatus will now be described with reference to FIGS. 11 to 13.

First, as shown in (S1) in FIG. 11, the carrying hands are positioned at the rack delivery/receipt position (the position where the mounting member 30 has the height H1) together with the mounting member 30 and the upper push member 50 by the elevation driving of the first elevation driving mechanism 40.

Then, as shown in (S2) in FIG. 11, the upper push member 50 and the carrying hands 70 move up all together (in synchronization with each other) by the upward movement operation of the second elevation driving mechanism 60, the upper push member 50 moves away from the upper frame R1 to release the pushing from the upper side (a pushing releasing step), and then the carrying hands 70 carry the upper frame R1 from the lower side at the retracted position to maintain the rack R in the suspended state (a carrying step).

Subsequently, as shown in (S3) in FIG. 12, the carrying hands 70 move from the retracted position where the carrying hands 70 face the upper push member 50 toward the protruding position where the carrying hands 70 protrude in the horizontal direction X by the protrusion driving of the horizontal driving mechanism 80, thereby positioning the rack R immediately above (the transferring position of) the rack area A1.

Then, as shown in (S4) in FIG. 12, the carrying hands 70 move down for a predetermined height together with the mounting member 30 and the upper push member 50 to shift the rack R to (the shift position in) the rack area A1 by the lowering operation of the first elevation driving mechanism 40, and the carrying hands 70 move apart from the upper frame R1 (a shifting step).

Subsequently, as shown in (S5) in FIG. 13, the carrying hands 70 move to and stop at the retracted position where the carrying hands 70 face the upper push member 50 from the lower side by the retraction driving of the horizontal driving mechanism 80.

Since the carrying-out operation of the rack R is performed as a series of operations, i.e., the pushing release step, the carrying step, and the shifting step in this manner, the rack R can be smoothly carried out and shifted from the predetermined position to the rack area A1.

Further, in this example, since the elevating operation for the upper push member 50 and the elevating operation for the carrying hands 70 are performed in synchronization with each other, the operation for carrying and suspending the rack R by the carrying hands 70 can be smoothly continuously effected after the operation for releasing the pushing of the rack R by the upper push member 50.

As explained above, according to the component transfer apparatus and method, since the rack R can be smoothly carried in or carried out and the components W can be smoothly supplied and retrieved, operation efficiency can be improved, and productivity can be enhanced.

In particular, since the upper push member 50 is arranged to face the mounting member 30 from above and the carrying hands 70 are arranged to face the upper push member 50 from below at the retracted position, a series of carrying-in operations, i.e., carrying in the rack R by the carrying hands 70, mounting the rack R on the mounting member 30, and pushing the rack R by the upper push member 50, the positioning operation or the positioning release, and the carrying-out operation can be smoothly and efficiently performed. Moreover, since the rack R is transferred in the state that the carrying hands 70 carry and suspend the upper frame R1 from the lower side, the upright posture can be maintained by its own weight, or impact shock and others produced at the time of sliding and shifting can be avoided, thereby preventing the components W from falling or being damaged.

Additionally, if each of the mounting member 30, the upper push member 50, the carrying hands 70, and the inclination restricting members 90 can function in this component transfer apparatus, it is possible to flexibly cope with various kinds of racks, and the respective driving mechanisms 40, 60 and 80 can integrate the energy systems since the driving force is generated by using all the driving motors 42, 62, and 84, thereby contributing to a reduction in cost.

Although the carrying hands 70 are movably provided to the upper push member 50 in the foregoing embodiment, the present invention is not restricted thereto, and the carrying hands may be supported with respect to the support member 20 separately from the upper push member 50 so as to be capable of moving up and down and horizontally reciprocating.

Although the upper push member 50 is provided to move up and down with respect to the mounting member 30 in the foregoing embodiment, the present invention is not restricted thereto, and it may be configured to be supported with respect to the support member 20 so as to be capable of moving up and down so that it can relatively move up and down with respect to the mounting member 30.

Although the second elevation driving mechanism 60 that drives the upper push member 50 to move up and down is provided to the mounting member 30 in the foregoing embodiment, the present invention is not restricted thereto, and it may be provided to the upper push member or may be provided to the support member 20.

Although the four push portions (the two push portions 51 and the two push portions 52) that push the upper frame R1 of the rack R at four positions are provided to the upper push member 50 in the foregoing embodiment, the present invention is not restricted thereto, it is possible to adopt a structure where the push portions 52 each having a flat shape are eliminated and the push portions 51 each having the inclined surface 51a as the guide portion alone are provided. In this case, even though the rack R is slightly deformed, it can be assuredly pushed from above and positioned and fixed at a predetermined position.

Although the delivery/receipt position of the rack R is the same height position (the position of H1) in the foregoing embodiment, the present invention is not restricted thereto, and a receipt position of the rack R and a delivery position of the rack R may be set to different height positions (e.g., the receipt position of the rack R may be set to a "lower position" that is a low position, and the delivery position of the rack R may be set to an "upper position" that is a high position).

INDUSTRIAL APPLICABILITY

As described above, the component transfer apparatus and method according to the present invention can flexibly cope various kinds of racks (or magazines, cassettes, and others) that are utilized when supplying and retrieving components and can smoothly and highly accurately perform transfer and positioning of the racks while achieving simplification, miniaturization, or cost reduction of the configuration, and hence can smoothly supply and retrieve the components, whereby they can be of course utilized in, e.g., a production line for transferring components of electronic devices or a production line for transferring mechanical components and they are useful in a transfer line for transferring components in any other fields.

The invention claimed is:

1. A component transfer apparatus that transfers components by transferring and positioning a rack at a predetermined position, the rack including an upper frame, a lower frame, and vertical frames at four corners, the apparatus comprising:
a mounting member configured to mount the lower frame of the rack thereon, the mounting member being moveable in an up and down direction;
a first elevation driving mechanism configured to drive the mounting member so as to be capable of moving up and down;
an upper push member disposed so as to be capable of coming into contact with a part of the mounting member, and being configured to be driven to move up and down to push the upper frame of the rack from above;
a second elevation driving mechanism disposed at a portion at which the mounting member and the upper push member come into contact with each other on the mounting member, and being configured to drive the upper push member so as to be capable of moving up and down;
a pair of carrying hands attached to the upper push member at a face opposed to a rack mounting face of the mounting member, and being disposed so as to protrude with respect to the upper push member to carry the rack in and out in a horizontal direction; and
a horizontal driving mechanism configured to drive the pair of carrying hands so as to be capable of moving in and out in the horizontal direction,
wherein the mounting member includes an inclination restricting member configured to restrict an inclination of the rack when the rack is mounted on the mounting member, and the inclination restricting member is disposed so as to engage with outer surfaces of the vertical frames of the rack and engage with inner surfaces of the vertical frames of the rack when the carrying hands retract below the upper push member from a protruding condition.

2. The component transfer apparatus according to claim 1, wherein each of the carrying hands has carrying portions for carrying the upper frame of the rack.

3. The component transfer apparatus according to claim 1, wherein the upper push member is configured so as to be capable of moving up and down with respect to the mounting member, and
the horizontal driving mechanism is configured to move the pair of carrying hands with respect to the upper push member in the horizontal direction alone.

4. The component transfer apparatus according to claim 3, wherein a guide portion configured to receive the lower frame of the rack and guide the lower frame to the predetermined position is disposed in the mounting member, and
a guide portion configured to receive the upper frame of the rack and guide the upper frame to the predetermined position is disposed in the upper push member.

5. The component transfer apparatus according to claim 1, wherein the first elevation driving mechanism includes an elevation guide rail extending in a vertical direction, and an elevation guided portion disposed on the mounting member so as to be capable of being guided along the elevation guide rail; and
the upper push member includes an upper elevation guided portion configured to be slidably guided along the elevation guide rail.

6. The component transfer apparatus according to claim 3, wherein the horizontal driving mechanism includes a horizontal guide rail configured to extend in the horizontal direction on an underside of the upper push member, and a horizontal guided portion disposed on the carrying hand so as to be capable of being slidably guided along the horizontal guide rail.

7. A component transfer apparatus that transfers components by transferring and positioning a rack at a predetermined position, the rack including an upper frame, a lower frame, and vertical frames at four corners, the apparatus comprising:
a mounting member configured to mount the lower frame of the rack thereon, the mounting member being movable in an up and down direction;
a first elevation driving mechanism configured to drive the mounting member so as to be capable of moving up and down;
an upper push member disposed so as to be capable of coming into contact with a part of the mounting member, and being configured to be driven to move up and down to push the upper frame of the rack from above;
a second elevation driving mechanism disposed at a portion at which the mounting member and the upper push member come into contact with each other on the mounting member, and being configured to drive the upper push member so as to be capable of moving up and down;

a pair of carrying hands attached to the upper push member at a face opposed to a rack mounting face of the mounting member, and being disposed so as to protrude with respect to the upper push member to carry the rack in and out in a horizontal direction;

a horizontal driving mechanism configured to drive the pair of carrying hands so as to be capable of moving in and out in the horizontal direction; and a base member installed on a floor and supporting the first elevation driving mechanism, wherein the mounting member includes an inclination restricting member configured to restrict an inclination of the rack when the rack is mounted on the mounting member, and the inclination restricting member is disposed so as to engage with outer surfaces of the vertical frames of the rack and engage with inner surfaces of the vertical frames of the rack when the carrying hands retract below the upper push member from a protruding condition.

8. The component transfer apparatus according to claim 7, wherein the first elevation driving mechanism includes an elevation guide rail fixed to the base member and extending in a vertical direction, and an elevation guided portion disposed on the mounting member so as to be capable of being guided along the elevation guide rail; and the upper push member includes an upper elevation guided portion configured to be slidably guided along the elevation guide rail.

9. The component transfer apparatus according to claim 7, wherein each of the carrying hands has carrying portions for carrying the upper frame of the rack.

10. A component transfer apparatus that transfers components by transferring and positioning a rack at a predetermined position, the rack including an upper frame, a lower frame, and vertical frames at four corners, the apparatus comprising:

a mounting member configured to mount the lower frame of the rack thereon;

an upper push member arranged to face the mounting member from above and being configured to be driven to move up and down to push the upper frame of the rack from above;

a carrying hand disposed so as to be capable of entering a space between the upper frame and the lower frame of the rack in an inside space defined by the upper frame, the lower frame, and the vertical frames of the rack, and the carrying hand is capable of protruding with respect to the upper push member in a horizontal direction to carry the rack in and out;

a horizontal driving mechanism configured to drive the carrying hand in the horizontal direction;

a first elevation driving mechanism configured to drive the mounting member, the upper push member and the carrying hand so as to be capable of moving up and down; and a second elevation driving mechanism disposed on the mounting member and being configured to drive the upper push member and the carrying hand together so as to be capable of moving up and down, wherein the upper push member and the carrying hand are configured such that the carrying hand is capable of separating from the rack to release a suspension of the rack and the second elevation driving mechanism is operable to drive the upper push member downward to push the rack toward the mounting member, and to move the upper push member away from the mounting member and separate from the rack to release the push of the rack, and the second elevational driving mechanism is operable to drive the carrying hand in an upward direction to suspend the rack.

* * * * *